US012193301B2

United States Patent
Joo et al.

(10) Patent No.: US 12,193,301 B2
(45) Date of Patent: Jan. 7, 2025

(54) DISPLAY DEVICE

(71) Applicant: Samsung Display Co., Ltd., Yongin-si (KR)

(72) Inventors: Sun-Kyu Joo, Suwon-si (KR); Keunchan Oh, Hwaseong-si (KR); Byung-Chul Kim, Suwon-si (KR); Inok Kim, Osan-si (KR); Gak Seok Lee, Hwaseong-si (KR); Jieun Jang, Suwon-si (KR); Inseok Song, Pocheon-si (KR); Chang-Soon Jang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 659 days.

(21) Appl. No.: 17/356,308

(22) Filed: Jun. 23, 2021

(65) Prior Publication Data
US 2021/0320155 A1    Oct. 14, 2021

Related U.S. Application Data

(62) Division of application No. 16/532,279, filed on Aug. 5, 2019, now Pat. No. 11,063,092.

(30) Foreign Application Priority Data

Oct. 5, 2018  (KR) .................. 10-2018-0118903

(51) Int. Cl.
*H10K 59/35*  (2023.01)
*H10K 50/824* (2023.01)
(Continued)

(52) U.S. Cl.
CPC ......... *H10K 59/352* (2023.02); *H10K 50/824* (2023.02); *H10K 59/122* (2023.02); *H10K 59/126* (2023.02)

(58) Field of Classification Search
CPC .. H10K 59/352; H10K 50/824; H10K 59/122; H10K 59/126; H10K 50/865;
(Continued)

(56) References Cited

U.S. PATENT DOCUMENTS 7,372,527 B2   5/2008  Kawase
9,798,199 B2  10/2017  Chen et al.
(Continued)

FOREIGN PATENT DOCUMENTS

JP  2011040352 A  2/2011
JP  2014067576 A  4/2014
(Continued)

*Primary Examiner* — Bitew A Dinke
(74) *Attorney, Agent, or Firm* — Lewis Roca Rothgerber Christie LLP

(57) ABSTRACT

A display device includes: a first base layer; a circuit element layer on the first base layer; a pixel definition layer on the circuit element layer and comprising a plurality of light-emitting openings which are spaced apart from each other and define a plurality of light-emitting regions; a second base layer spaced apart from and facing the first base layer; a light-shielding layer on the second base layer and comprising a plurality of openings respectively overlapping the light-emitting regions, wherein on a plane of the first base layer, shapes of first to third openings along one direction among the openings are different from each other.

10 Claims, 15 Drawing Sheets

(51) Int. Cl.
*H10K 59/122* (2023.01)
*H10K 59/126* (2023.01)

(58) Field of Classification Search
CPC .. H10K 59/1315; H10K 59/88; H10K 59/124; H10K 59/12; H10K 59/1213; H10K 59/351; H10K 2102/302
See application file for complete search history.

(56) References Cited

U.S. PATENT DOCUMENTS

| | | | |
|---|---|---|---|
| 9,817,264 | B2 | 11/2017 | Li |
| 10,325,973 | B2 | 6/2019 | Motoyama et al. |
| 10,360,845 | B2 | 7/2019 | Park et al. |
| 11,063,092 | B2* | 7/2021 | Joo ............... H10K 59/122 |
| 2002/0158835 | A1* | 10/2002 | Kobayashi ......... H10K 50/818 345/100 |
| 2007/0194696 | A1* | 8/2007 | Hsu ............... H10K 59/122 313/504 |
| 2007/0194699 | A1* | 8/2007 | Lee ............ H10K 59/805 313/498 |
| 2009/0256168 | A1* | 10/2009 | Taneda ........... H10K 59/1315 257/E33.061 |
| 2010/0025664 | A1* | 2/2010 | Park ............ H10K 59/121 438/34 |
| 2011/0043096 | A1 | 2/2011 | Asaki |
| 2015/0069356 | A1* | 3/2015 | Lee ............... H10K 50/814 257/40 |
| 2016/0111478 | A1* | 4/2016 | Hong ............ H10K 50/8426 257/40 |
| 2016/0172634 | A1 | 6/2016 | Kim et al. |
| 2016/0293677 | A1* | 10/2016 | Oooka ........... H10K 59/805 |
| 2016/0300889 | A1* | 10/2016 | Kim ............... H10K 71/00 |
| 2016/0378224 | A1* | 12/2016 | Kwon ............ H10K 59/8731 345/174 |
| 2017/0054111 | A1* | 2/2017 | Kim ............... H10K 50/856 |
| 2017/0062540 | A1* | 3/2017 | Kim ............... H10K 50/841 |
| 2017/0141180 | A1* | 5/2017 | Matsumoto ....... H10K 59/122 |
| 2017/0149018 | A1* | 5/2017 | Choi .............. H10K 59/122 |
| 2017/0179206 | A1 | 6/2017 | Lee et al. |
| 2017/0237037 | A1* | 8/2017 | Choi ............... G04B 19/04 257/40 |
| 2017/0256747 | A1* | 9/2017 | Lee ............... H10K 59/353 |
| 2017/0271420 | A1 | 9/2017 | Tsai et al. |
| 2017/0271450 | A1 | 9/2017 | Takahashi |
| 2017/0287992 | A1* | 10/2017 | Kwak ............. H10K 59/40 |
| 2017/0338292 | A1* | 11/2017 | Choi ............... H10K 59/352 |
| 2018/0102499 | A1* | 4/2018 | Pyo ............... H10K 50/814 |
| 2018/0130865 | A1* | 5/2018 | Kim ............... H10K 59/878 |
| 2018/0197922 | A1 | 7/2018 | Song |
| 2018/0233694 | A1 | 8/2018 | Ajiki et al. |
| 2019/0067396 | A1* | 2/2019 | Cheng ............. H10K 71/00 |
| 2019/0206945 | A1* | 7/2019 | Lin ............... H01L 27/14621 |
| 2021/0343803 | A1* | 11/2021 | Cheng ............ H10K 59/122 |

FOREIGN PATENT DOCUMENTS

| | | |
|---|---|---|
| JP | 2018133242 A | 8/2018 |
| KR | 10-0519134 B1 | 10/2005 |
| KR | 10-2014-0097638 A | 8/2014 |
| KR | 10-2016-0035685 A | 4/2016 |
| KR | 10-2016-0038628 A | 4/2016 |
| KR | 10-2016-0059575 A | 5/2016 |
| KR | 20160129932 A | 11/2016 |
| KR | 10-2016-0149599 A | 12/2016 |
| KR | 10-2017-0040180 A | 4/2017 |

* cited by examiner

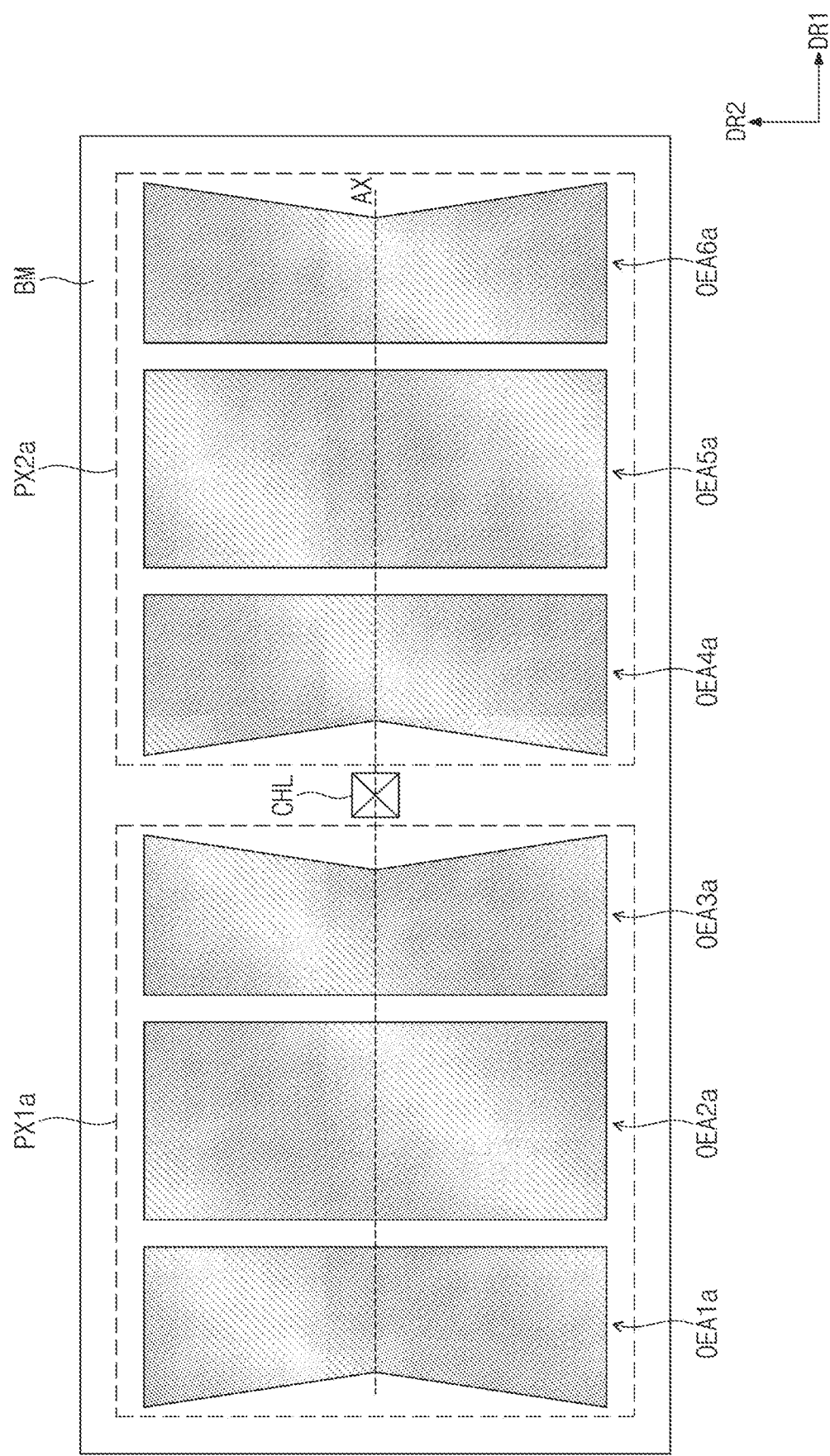

DISPLAY DEVICE

CROSS-REFERENCE TO RELATED APPLICATIONS

This application is a divisional of U.S. patent application Ser. No. 16/532,279, filed Aug. 5, 2019, which claims priority to and the benefit of Korean Patent Application No. 10-2018-0118903, filed Oct. 5, 2018, the entire content of both of which is incorporated herein by reference.

BACKGROUND

Aspects of some example embodiments of the present disclosure herein relate to a display device.

Display devices include, for example, liquid crystal display devices, plasma display devices, organic light-emitting display devices, etc. Among these, liquid crystal display devices are manufactured by using a semiconductor process and the manufacturing process may make it difficult to manufacture liquid crystal display devices with relatively large screens. In addition, due to the use of backlight units, liquid crystal display devices have relatively large power consumption. In addition, liquid crystal display devices may have relatively high levels of light loss due to optical components such as polarization filters, prism sheets, and diffusion plates, and liquid crystal display devices may have relatively small viewing angles.

In comparison, organic light-emitting display devices have a self light-emitting element that emits light by itself. Additionally, organic light-emitting display devices have a relatively fast response speed, and can be manufactured in a lightweight, thin structure. In addition, organic light-emitting display devices may have a relatively high light-emitting efficiency and brightness, and a relatively large viewing angle.

The above information disclosed in this Background section is only for enhancement of understanding of the background of the invention and therefore it may contain information that does not constitute prior art.

SUMMARY

Aspects of some example embodiments of the present disclosure herein relate to a display device, and for example, to a display device having improved visibility.

Aspects of some example embodiments of the present disclosure include a display device having relatively improved visibility and the capability of reducing light leaks.

Some example embodiments of the inventive concept include a display device including: a first base layer; a circuit element layer on the first base layer; a pixel definition layer on the circuit element layer and including a plurality of light-emitting openings which are spaced apart from each other, and are configured to define a plurality of light-emitting regions; a second base layer spaced apart from and facing the first base layer; a light-shielding layer on the second base layer and including a plurality of openings respectively overlapping the light-emitting regions, wherein on a plane of the first base layer, shapes of first to third openings continued in one direction among the openings are different from each other.

According to some example embodiments, on the plane, the area of each of the light-emitting regions may be smaller than the area of any one among the openings.

According to some example embodiments, the second opening may be between the first opening and the third opening, and on the plane, the area of the second opening may be larger than the area of each of the first opening and the third opening.

According to some example embodiments, on the plane, the second opening may be provided with a first opening region and a second opening region which are line symmetrical according to a central axis and respectively have equilateral trapezoidal shapes, and the first opening and the third opening may respectively be provided with a third opening region and a fourth opening region which are line symmetrical according to a central axis and respectively have parallelogram shapes.

According to some example embodiments, on the plane, the second opening may be provided with an opening region having a rectangular shape, and the first opening and the third opening may respectively be provided with a first opening region and a second opening region which are line symmetrical according to central axes and respectively have trapezoidal shapes.

According to some example embodiments, on the plane, the first opening and the third opening may be line symmetrical to each other.

According to some example embodiments, the second opening may be between the first opening and the third opening which are symmetrical to each other, and on the plane, the area of the second opening may be larger than the area of each of the first opening and the third opening.

According to some example embodiments, on the plane, the second opening may be provided with an opening region having a rectangular shape, and each of the first opening and the third opening may be provided with a first opening region and a second opening region which are line symmetrical according to central axes and respectively have trapezoidal shapes.

According to some example embodiments, the pixel definition layer may further include through holes overlapping between the first to third openings and fourth to sixth openings continuing in the one direction.

According to some example embodiments, the display device further comprises a plurality of first electrodes on the circuit element layer and respectively having portions exposed by the light-emitting openings, a light-emitting layer on the first electrodes, a second electrode on the pixel definition layer and covering the light-emitting layer. And, the second electrode may be electrically connected to the circuit element layer via the through hole overlapping the light-shielding layer.

According to some example embodiments, the display device further comprises a plurality of first electrodes on the circuit element layer and respectively having portions exposed by the light-emitting openings, a light-emitting layer on the first electrodes, a second electrode on the pixel definition layer and covering the light-emitting layer. And, the circuit element layer may include: a plurality of transistors on the first base layer and electrically connected to the light-emitting layer; and a dummy transistor on the first base layer and electrically connected to the second electrode via the through hole.

According to some example embodiments, shapes of the first to third openings may respectively correspond to shapes of the fourth to sixth openings.

According to some example embodiments of the inventive concept, a display device includes: a first base layer; a circuit element layer on the first base layer; a display element layer electrically connected to the circuit element layer and including a plurality of light-emitting regions; a second base layer spaced apart from and facing the first base layer; and a light-shielding layer on the second base layer and including a plurality of openings respectively overlapping the light-emitting regions, wherein on a plane of the first base layer, shapes of first to third openings continuing in one direction among the plurality openings are different from each other.

According to some example embodiments, the light-emitting regions may include: a first light-emitting group and a second light-emitting group which are arranged along a first row and are spaced apart from each other with a first through hole passing through a portion of each of the display element layer and the circuit element layer therebetween; and a third light-emitting group and a fourth light-emitting group which are arranged along a second row and are spaced apart from each other with a second through hole passing through a portion of each of the display element layer and the circuit element layer therebetween.

According to some example embodiments, each of the first to fourth light-emitting groups may include a plurality of sub light-emitting regions, the sub light-emitting region, of the first light-emitting group, most adjacent to the second light-emitting group may emit a first color light, the sub light-emitting region, of the second light-emitting group, most adjacent to the first light-emitting group may emit a second color light, the sub light-emitting region, of the third light-emitting group, most adjacent to the fourth light-emitting group may emit the second color light, and the sub light-emitting region, of the fourth light-emitting group, most adjacent to the third light-emitting group may emit a first color light.

According to some example embodiments, the light-emitting regions may further include a fifth light-emitting group and a sixth light-emitting group which are arranged along a third row and spaced apart from each other with a third through hole passing through a portion of each of the display element layer and the circuit element layer.

According to some example embodiments, each of the first to fourth light-emitting groups may include a plurality of sub light-emitting region, the sub light-emitting regions, of the first light-emitting group, most adjacent to the second light-emitting group may emit a first color light, the sub light-emitting region, of the second light-emitting group, most adjacent to the first light-emitting group may emit a second color light, the sub light-emitting region, of the third light-emitting group, most adjacent to the fourth light-emitting group may emit a third color light, the sub light-emitting region, of the fourth light-emitting group, most adjacent to the third light-emitting group may emit a first color light, the sub light-emitting region, of the fifth light-emitting group, most adjacent to the sixth light-emitting group may emit the first color light, and the sub light-emitting region, of the sixth light-emitting group, most adjacent to the fifth light-emitting group may emit the third color light.

According to some example embodiments, the circuit element layer may include: a plurality of transistors on the first base layer and electrically connected to the respective display element layers; and a first dummy transistor and a second dummy transistor which are on the first base layer and electrically connected to the respective display element layers through the first and second through holes.

According to some example embodiments, the light-emitting regions may include: a first light-emitting group and a second light-emitting group which are arranged along a first row and are spaced apart from each other with a first through hole passing through a portion of each of the display element layer and the circuit element layer therebetween; a third light-emitting group and a fourth light-emitting group which are arranged along a second row; and a fifth light-emitting group and a sixth light-emitting group which are arranged along a third row and spaced apart from each other with a second through hole passing through a portion of each of the display element layer and the circuit element layer therebetween.

According to some example embodiments of the inventive concept, a display device includes: a first base layer; a circuit element layer on the first base layer; a display element layer electrically connected to the circuit element layer and including a plurality of light-emitting regions; a second base layer spaced apart from and facing the first base layer; and a light-shielding layer on the second base layer and including a plurality of openings respectively overlapping the light-emitting regions, wherein the light-emitting regions include: a first light-emitting group and a second light-emitting group which are arranged along a first row and are spaced apart from each other with a first through hole passing through a portion of each of the display element layer and the circuit element layer therebetween; and a third light-emitting group and a fourth light-emitting group which are arranged along a second row and are spaced apart from each other with a second through hole passing through a portion of each of the display element layer and the circuit element layer therebetween.

BRIEF DESCRIPTION OF THE FIGURES

The accompanying drawings are included to provide a further understanding of the inventive concept, and are incorporated in and constitute a part of this specification. The drawings illustrate aspects of some example embodiments of the inventive concept and, together with the description, serve to explain principles of the inventive concept. In the drawings:

FIG. 8B is a plan view of pixels according to some example embodiments of the inventive concept;

DETAILED DESCRIPTION

Figure 1:
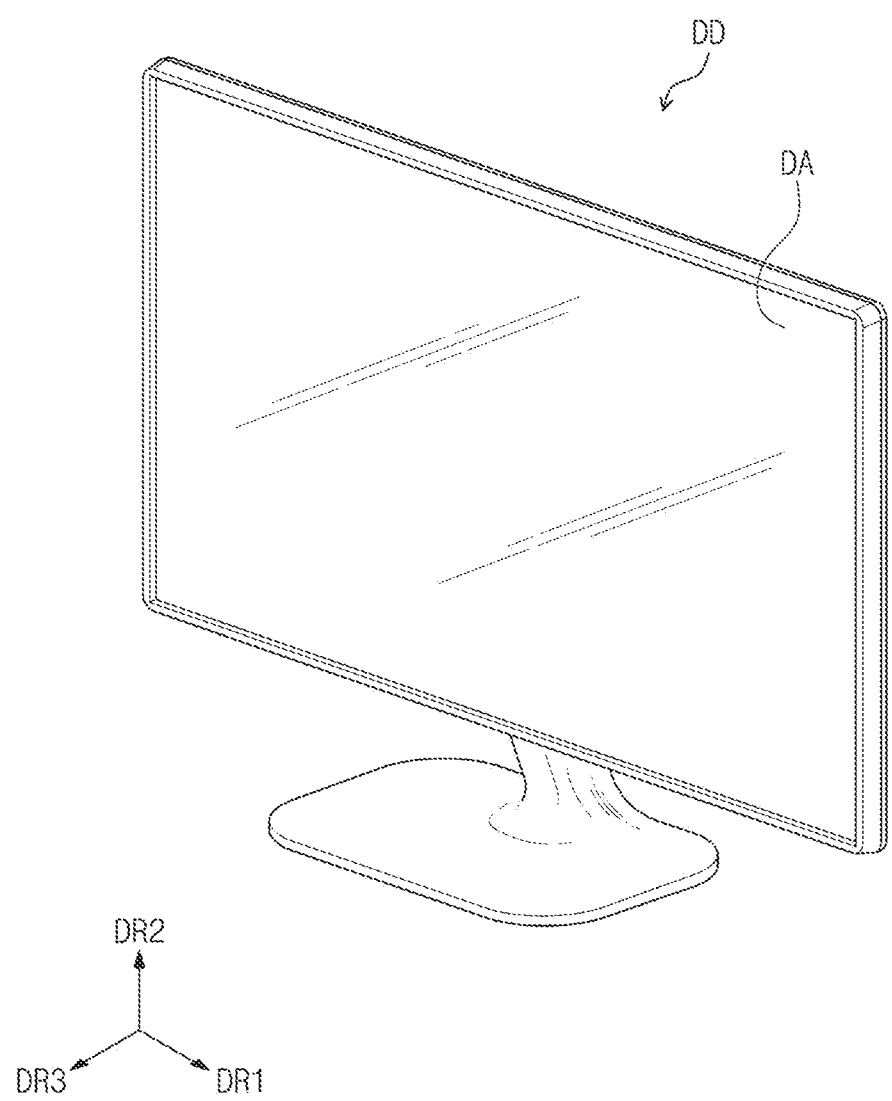
FIG. 1 is a perspective view of a display device according to some example embodiments of the inventive concept.

In this specification, it will be understood that when an element (or a region, a layer, portion, etc.) is referred to as "being on", "connected to" or "coupled to" another element or layer, it can be directly on, connected or coupled to the other element or a third intervening element may be present therebetween.

Like reference numerals refer to like elements. Also, in the figures, the thicknesses, the ratios and the dimensions of elements are exaggerated for effective illustration of technological contents.

As, used herein, the term "and/or" includes all of one or more combinations that can be defined by associated items.

It will be understood that although the terms "first" and "second" may be used herein to describe various elements, these elements should not be limited by these terms. The terms are only used to distinguish one element from other elements. For example, a first element may be referred to as a second element and the second element may similarly be referred to as the first element without departing from the scope of the present disclosure. The terms of a singular form may include plural forms unless obviously referred to the contrary in context.

In addition, terms such as "below", "lower", "above", and "upper" may be used to describe the relationship between features illustrated in the figures. The terms have relative concept, and are described on the basis of the orientation illustrated in the figures.

Unless otherwise defined, all terns (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless so defined herein.

It will be further understood that the term "include" or "have", when used in this specification, specifies the presence of stated features, numbers, steps, operations, elements, components or combinations thereof, but do not preclude the presence or addition of one or more other features, integers, steps, operations, elements, components, and/or combinations thereof.

Hereinafter, aspects of some example embodiments of the inventive concept will be described with reference to the accompanying drawings.

Figure 2:
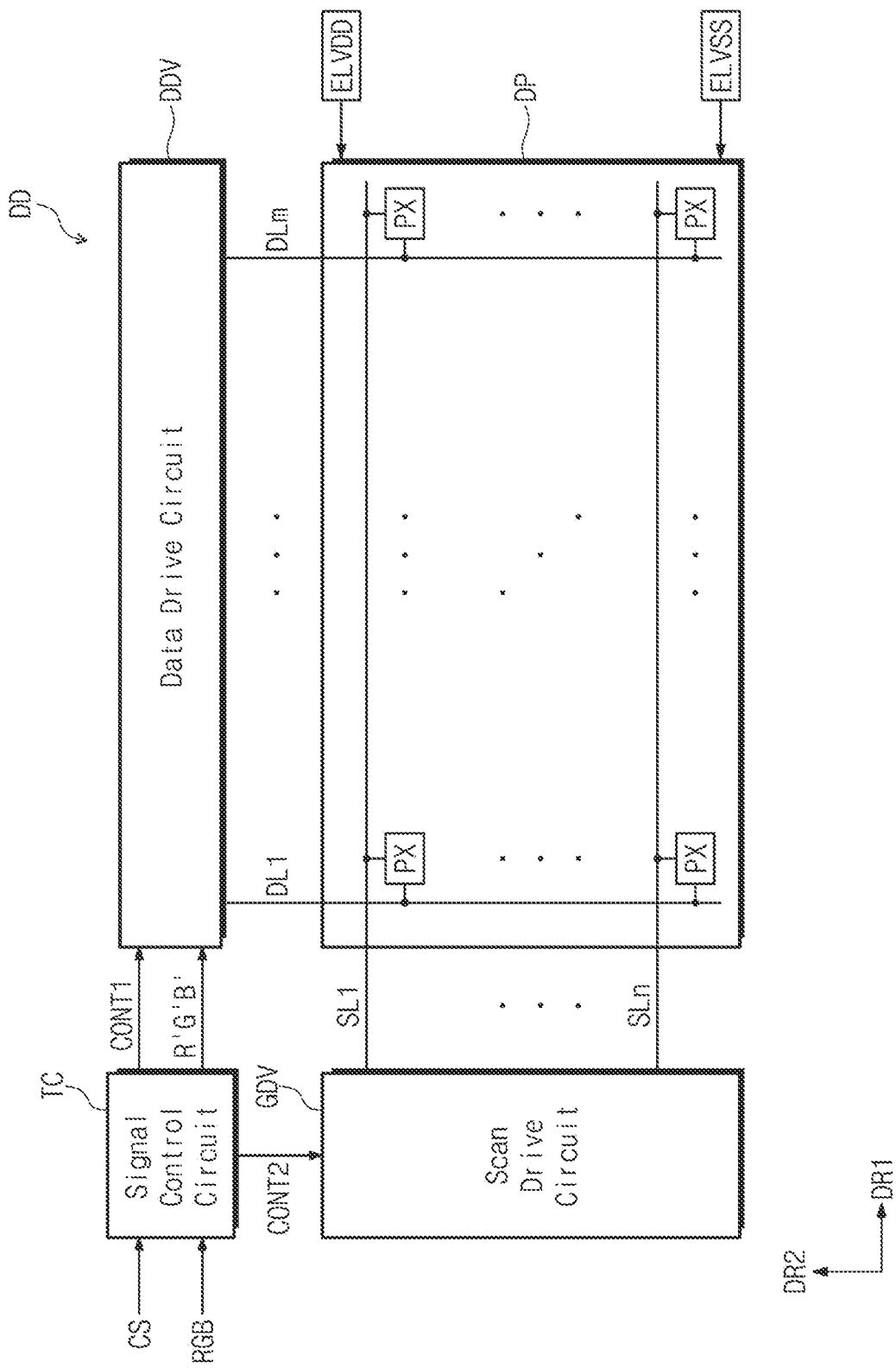
FIG. 2 is a block diagram of a display device according to some example embodiments of the inventive concept.

FIG. 1 is a perspective view of a display device according to some example embodiments of the inventive concept. FIG. 2 is a block diagram of a display device according to some example embodiments of the inventive concept.

Referring to FIG. 1, a display device DD may display an image through a display region DA. FIG. 1 illustrates an example of a display region DA provided on a surface defined by a first direction DR1 and a second direction DR2 crossing the first direction DR1. However, according to some example embodiments of the inventive concept, the display region of the display device may be provided on a curved surface. In addition, although not shown in FIG. 1, according to some example embodiments, the display device DD may further include a non-display region adjacent to the display region DA, and the non-display region may be a region from which no image is viewed. The non-display region may be positioned adjacent to one region of the display region DA or may surround the display region DA.

The thickness direction of the display device DD is indicated by a third direction DR3. The directions indicated by the first to third directions DR1, DR2, and DR3 are a relative concept and may be converted into other directions. In this specification, the wording "when viewed in a plane or on a plane" may mean a case of viewing in the third direction DR3. In addition, the "thickness direction" may be the third direction DR3.

FIG. 1 illustrates an example embodiment in which the display device DD is a television. However, embodiments are not limited thereto, and the display device DD may be used for a large-sized electronic apparatus such as a monitor, or external advertising board, and a small and medium-sized electronic apparatus, such as a personal computer, a laptop computer, a personal digital terminal, a car navigation unit, a game machine, a smartphone, a tablet, and a camera. In addition, these are only presented as embodiments, and may be, of course, applied to other electronic devices without departing from the inventive concept.

Referring to FIG. 2, a display device DD may include a display panel DP, a signal control circuit TC, a data drive circuit DDV, and a scan drive circuit GDV. Each of the signal control circuit TC, the data drive circuit DDV, and the scan drive circuit GDV may include a plurality of circuits.

The display panel DP may include a plurality of data lines DL1-DLm, a plurality of scan lines SL1-SLn, and a plurality of pixels PX.

The plurality of data lines DL1-DLm may extend in a second direction DR2 and be arranged in a first direction DR1 crossing the second direction DR2. The plurality of scan lines SL1-SLn may extend in the first direction DR1 and be arranged in the second direction DR2.

Each of the pixels PX may include a light emitting element and a pixel circuit electrically connected to the light-emitting element. The pixel circuit may include a plurality of transistors. A first power supply voltage ELVDD and a second power supply voltage ELVSS may be provided to each of the pixels PX.

The pixels PX may be positioned with a certain rule on a plane of the display panel DP. Each of the pixels PX may display one among primary colors or one among mixed colors. The primary colors may include red, green and blue, and the mixed colors may include various colors such as yellow, cyan, magenta, and white. However, the colors displayed by the pixels PX are not limited thereto.

The signal control circuit TC receives image data RGB provided from the outside. The signal control circuit TC converts the image data RGB to meet the operation of the display panel DP, generates converted image data R'G'B', and outputs the converted image data R'G'B' to the data drive circuit DDV.

In addition, the signal control circuit TC may receive a control signal CS provided from the outside. The control signal CS may include a vertical synchronization signal, a horizontal synchronization signal, a main clock signal, and a data enable signal, and the like. The signal control circuit TC provides a first control signal CONT1 to the data drive circuit DDV and provides a second control signal CONT2 to the scan drive circuit GDV. The first control signal CONT1 is a signal for controlling the data drive circuit DDV, and the second control signal CONT2 is a signal for controlling the scan drive circuit GDV.

The data drive circuit DDV may respond to the first control signal CONT1 received from the signal control circuit TC and thereby drive the plurality of data lines DL1-DLm. The data drive circuit DDV may be implemented as an independent integrated circuit, and electrically connected to one side of the display panel DP or directly mounted on the display panel DP. In addition, the data drive circuit DDV may be implemented in a single chip or include a plurality of chips.

The scan drive circuit GDV may be integrated in a region (e.g., a predetermined region) of the display panel DP. For example, the scan drive circuit GDV may include a plurality of thin film transistors which are formed through the same process as the pixel circuits of the pixels PX, for example, a low temperature polycrystalline silicon (LTPS) process or a low temperature polycrystalline oxide (LTPO) process. In addition, the scan drive circuit GDV may be implemented as an independent integrated circuit chip and electrically connected to one side of the display panel DP.

Figure 3:
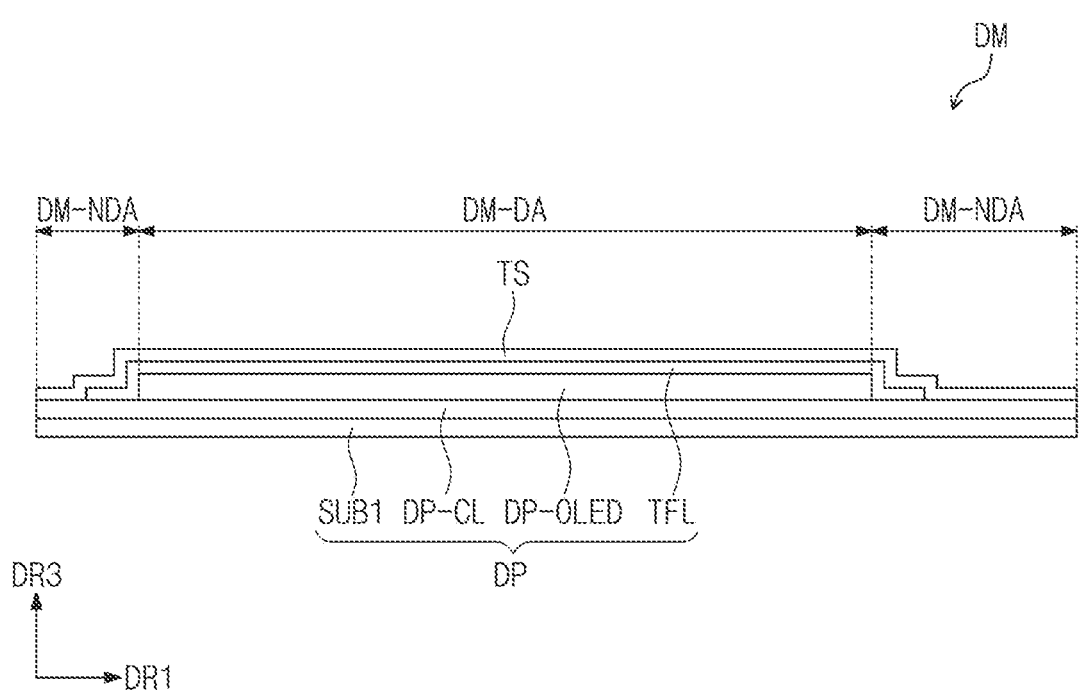
FIG. 3 is a cross-sectional view of a display module according to some example embodiments of the inventive concept.
Figure 4A:
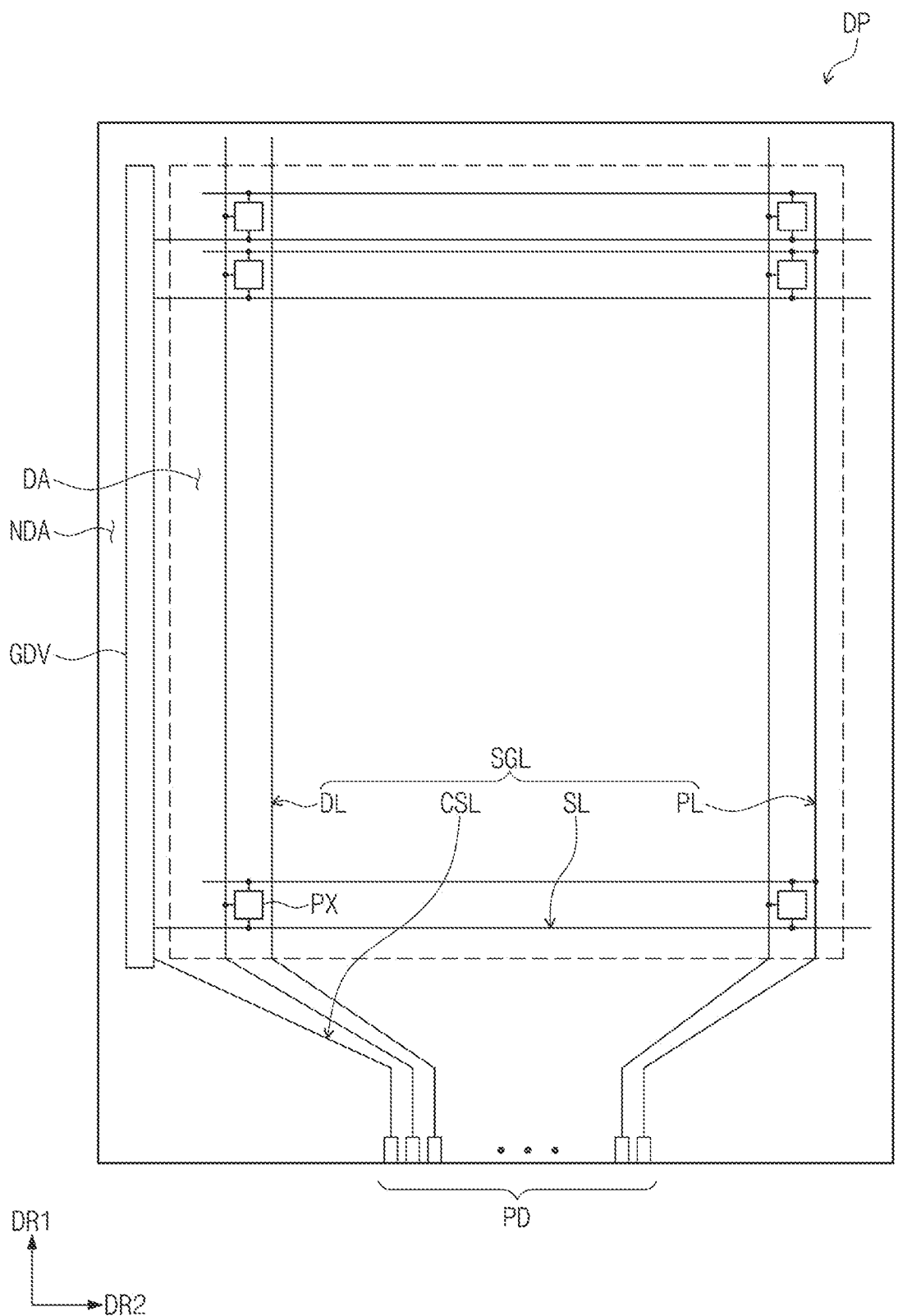
FIG. 4A is a plan view of a display panel according to some example embodiments of the inventive concept.
Figure 4B:
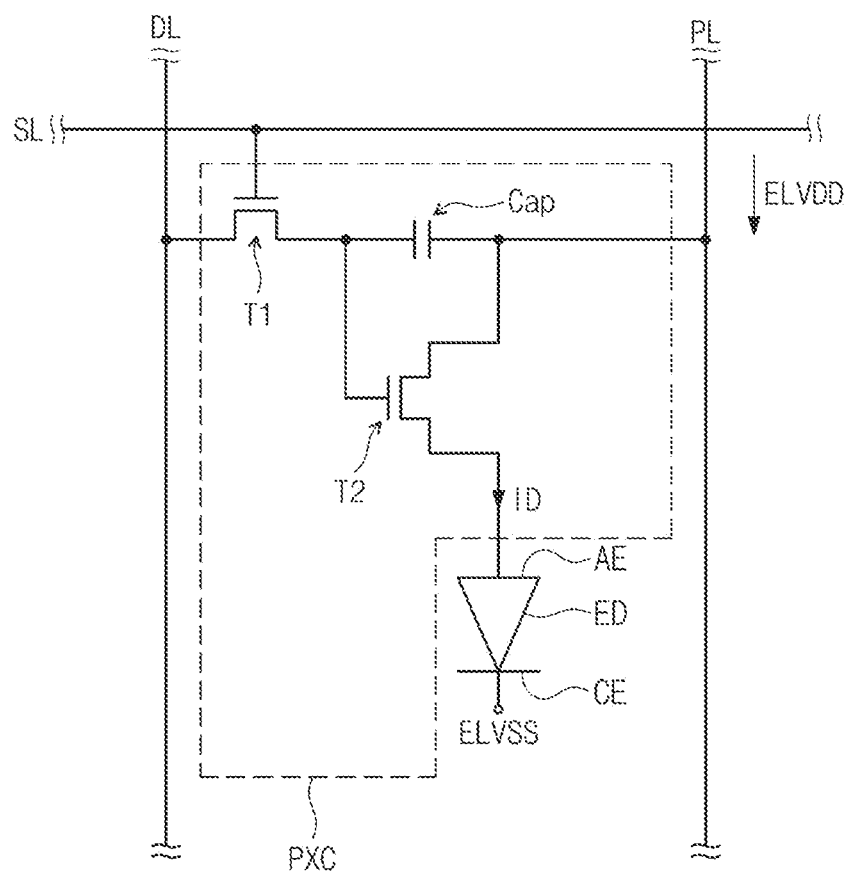
FIG. 4B is an equivalent circuit diagram of a pixel according to some example embodiments of the inventive concept.
Figure 4C:
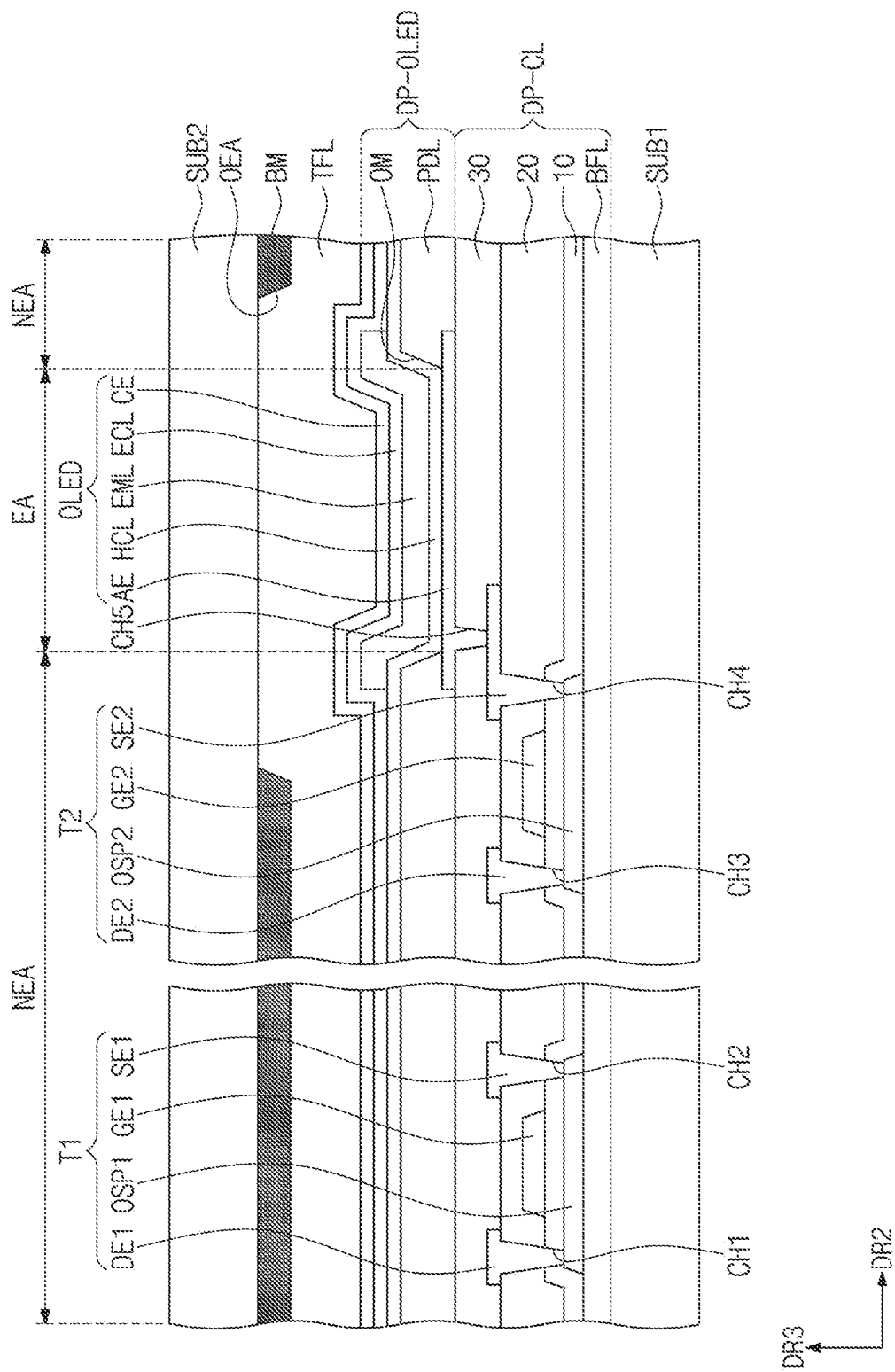
FIG. 4C is a partial cross-sectional view of a display panel according to some example embodiments of the inventive concept.

FIG. 3 is a cross-sectional view of a display module according to some example embodiments of the inventive concept. FIG. 4A is a plan view of a display panel according to some example embodiments of the inventive concept. FIG. 4B is an equivalent circuit diagram of a pixel according to some example embodiments of the inventive concept. FIG. 4C is a partial cross-sectional view of a display panel according to some example embodiments of the inventive concept.

Referring to FIG. 3, a display module DM includes a display panel DP and an input detection unit TS (or a touch detection unit). According to some example embodiments of the inventive concept, the display module DM is described to include the input detection unit TS, but according to some example embodiments, the input detection unit TS may not be included.

The display panel DP may be, but is not limited to, an organic light-emitting display panel. For example, the display panel DP may be an organic light-emitting display panel or a quantum dot light-emitting display panel. In the organic light-emitting display panel, a light-emitting layer contains an organic light-emitting material. In the quantum dot light-emitting display panel, a light-emitting layer contains quantum dots and quantum rods. Hereinafter the display panel DP of the inventive concept will be described with respect to an organic light-emitting display panel for convenience of description and brevity, but embodiments are not limited thereto, as described above.

The display panel DP includes a first base layer SUB1, and a circuit element layer DP-CL, a display element layer DP_OLED, and an insulating layer TFL which are positioned on the first base layer SUB1. The input detection unit TS may directly be positioned on the insulating layer TFL. In this specification, the wording "feature A is directly on feature B" means that an adhesive layer is not located between the feature A and the feature B.

The first base layer SUB1 may include at least one plastic film. The first base layer SUB1 is a flexible substrate and may include a plastic substrate, a glass substrate, a metal substrate, an organic/inorganic composite material substrate, or the like. The display region DA described with reference to FIG. 1 may correspond to a display region DM-DA defined on the first base layer SUB1. In addition, although not shown in FIG. 1, the display device DD may include a non-display region adjacent to the display region DA. As illustrated in FIG. 3, a non-display region DM-NDA is defined on the first base layer SUB1, and the non-display region DM-NDA may be adjacent to one side of the display region DM-DA or surround the display region DM-DA. According to some example embodiments, the non-display region DM-NDA may also be omitted.

The circuit element layer DP-CL may include at least one intermediate insulating layer and a circuit element. The intermediate insulating layer may include at least one intermediate inorganic film and at least one intermediate organic film. The circuit element may include signal lines, a driving circuit for pixels, and the like.

The display element layer DP-OLED includes a plurality of organic light-emitting diodes. The display element layer DP-OLED may further include an organic film such as a pixel definition layer.

The insulating layer TFL seals the display element layer DP-OLED. For example, the insulating layer TFL may be a thin film encapsulation layer. The insulating layer TFL protects the display element layer DP-OLED from foreign substances such as water, oxygen, or dust particles. Meanwhile, as illustrated in FIG. 3, the insulating layer TFL is illustrated to overlap each of the display region DM-DA and the non-display region DM-NDA, but the embodiment of the inventive concept is not limited thereto, and the insulating layer may not overlap the non-display region DM-NDA.

Referring to FIG. 4A, a display panel DP includes a display region DA and a non-display region NDA. The display region DA of the display panel DP may correspond to the display region DA of the display device DD illustrated in FIG. 1.

The display panel DP includes a scan drive circuit GDV, a plurality of signal lines SGL, a plurality of pixels PX, and a plurality of drive pads PD. A region in which the plurality of pixels PX are located is defined as the display region DA. The scam drive circuit GDV, the plurality of signal lines SGL, and the pixel drive circuit may be included in the circuit element layer DP-CL shown in FIG. 3.

The scan drive circuit GDV generates a plurality of scan signals and sequentially outputs the plurality of scan signals to the plurality of scan lines SL1-SLn (see FIG. 2). The scan drive circuit GDV may further output another different control signal to the drive circuits of the pixels PX.

The plurality of signal lines SGL include scan lines SL, data lines DL, a power line PL and a control signal line CSL. The scan lines SL and the data lines DL may correspond to the scan lines SL1-SLn and the data lines DL1 to DLm which are illustrated in FIG. 2.

The scan lines SL are respectively connected to the corresponding pixels among the plurality of pixels PX, and the data lines DL are respectively connected to the corresponding pixels PX among the plurality of pixels PX. The power line PL is connected to the plurality of pixels PX. In addition, the scan drive circuit GDV to which the scan lines SL are connected may be located in the non-display region NDA. The control signal line CSL may provide control signals to the scan drive circuit GDV.

Some of the scan lines SL, the data lines DL, the power line PL, and the control signal line CSL are located on the same layer and some are located on other layers. When the signal lines located on any one layer among the scan lines SL, the data lines DL, the power line PL, and the control signal line CSL are defined as a first signal line, the signal lines located on another layer may be defined as a second signal line. The signal lines located on still another layer may be defined as a third signal line.

The display panel DP may further include a plurality of drive pads PD electrically connected to the data lines DL, the power line PL, and the control signal line CSL. The drive pads PD may overlap the non-display region NDA.

FIG. 4B illustrates an example of the pixels PX connected to any one scan line SL, any one data line DL, and the power line PL. The configuration of the pixel PX is not limited thereto, but may be modified according to various embodiments.

According to some example embodiments of the inventive concept, the pixel PX includes an organic light-emitting element ED, a first electrode AE, a second electrode CE, and a pixel circuit PXC. The pixel PX includes an organic light-emitting element ED as a display element.

The organic light-emitting element ED, the first electrode AE and the second electrode CE may be included in the display element layer DP-OLED shown in FIG. 3.

The organic light-emitting element ED may be a front surface light-emitting type diode or a rear surface light-emitting type diode.

The pixel circuit PXC is a circuit unit for driving the organic light-emitting element ED, and includes a first transistor T1 (or switching transistor), a second transistor T2 (or drive transistor), and a capacitor Cap. The pixel circuit PXC may be included in the circuit element layer DP-CL shown in FIG. 3.

The organic light-emitting element ED generates light in response to an electrical signal provided from the first and second transistors T1 and T2.

The first transistor T1 outputs a data signal applied to the data line DL in response to a scan signal applied to the scan line SL. The capacitor Cap charges a voltage corresponding to the data signal received from the first transistor T1. A first power supply voltage ELVDD is provided to the first electrode AE via the second transistor T2, and the second power supply voltage ELVSS is provided to the second electrode CE. The second power supply voltage ELVSS may be a voltage lower than the first power supply voltage ELVDD.

The second transistor T2 is electrically connected to the organic light-emitting element ED via the first electrode AE. The second transistor T2 controls a drive current ID flowing through the organic light-emitting element ED corresponding to an amount of charges stored in the capacitor Cap. The organic light-emitting element ED emits light during a turn-on period of the second transistor T2.

FIG. 4C illustrates a partial cross-section of the display panel DP corresponding to the equivalent circuit shown in FIG. 4B. On the first base layer SUB1, the circuit element layer DP-CL, the display element layer DP-OLED, the insulating layer TFL, and the second base layer SUB2 are sequentially located.

The circuit element layer DP-CL includes at least one insulating layer and a circuit element. The circuit element includes a signal line, a drive circuit for pixel, and the like. The circuit element layer DP-CL may be formed through: a process for forming an insulating layer, a semiconductor layer and a conductive layer by coating, deposition, etc.; and a process for patterning the insulating layer, the semiconductor layer and the conductive layer by a photolithography process.

The circuit element layer DP-CL may include a buffer film BFL, a first intermediate inorganic film 10, and a second intermediate inorganic film 20, which are inorganic films, and an intermediate organic film 30 which is an organic film. The buffer film BFL may include a plurality of laminated inorganic films. FIG. 4C illustrates an example arrangement relationship of a first semiconductor pattern OSP1, a second semiconductor pattern OSP2, a first control electrode GE1, a second control electrode GE2, a first input electrode DE1, a first output electrode SE1, a second input electrode DE2, and the second output electrode SE2 which constitute a first transistor T1 and a second transistor T2. Examples of the first to fourth through holes CH1, CH2, CH3, and CH4 are also illustrated.

The display element layer DP-OLED may include an organic light-emitting element ED. The display element layer DP-OLED includes a pixel defining film PDL. For example, the pixel defining film PDL may be an organic layer.

The first electrode AE is located on the intermediate organic film 30. The first electrode AE is connected to the second output electrode SE2 through a fifth through hole CH5 passing through the intermediate organic film 30. A light-emitting opening OM is defined in the pixel defining film PDL. The light-emitting opening OM of the pixel defining film PDL exposes at least a portion of the first electrode AE.

According to some example embodiments, a spacer overlapping a portion of the pixel defining film PDL may be located on the upper surface of the pixel defining film PDL. The spacer may have a shape integrated with the pixel defining film PDL or an insulating structure formed by an additional process.

According to some example embodiments of the inventive concept, the pixel defining film PDL may include the plurality of light-emitting openings OM which defines a plurality of light-emitting regions EA. As illustrated in FIG. 4B, the display panel DP may include a light-emitting region EA and a non-light-emitting region NEA adjacent to the light-emitting region EA. The non-light-emitting region NEA may surround the light-emitting region EA. In this embodiment of the inventive concept, the light-emitting region EA is defined to correspond to a portion of the first electrode AE exposed by the light-emitting opening OM.

A positive hole control layer HCL may be commonly located on the light emitting region EA and the non-light-emitting region NEA. The positive hole control layer HCL includes a positive hole transportation layer and may further include a positive hole injection layer. A light-emitting layer EML is located on the positive hole control layer HCL. A light-emitting layer EML may be an organic light-emitting layer. The light-emitting layer EML may be located on the region corresponding to the light-emitting opening OM. That is, the light-emitting layer EML may be formed so as to be separated to each of the pixels. However, the embodiments of the inventive concept are not limited thereto, and the light-emitting layer EML may be provided in an integral shape while overlapping the pixels. The light-emitting layer EML may include an organic material and/or an inorganic material. The light-emitting layer EML may generate a colored light (e.g., a predetermined colored light).

An electron control layer ECL is located on the light-emitting layer EML. The electron control layer ECL includes an electron transportation layer and may further include an electron injection layer. The positive hole control layer HCL and the electron control layer ECL may be commonly formed on a plurality of pixels by using an open mask. The second electrode CE is located on the electron control layer ECL. The second electrode CE has an integrated shape and is commonly located on the electron control layer ECL included in each of the plurality of pixels.

The insulating layer TFL is located on the second electrode CE. The insulating layer TFL may be provided as a single encapsulation layer or a plurality of thin films.

The second base layer SUB2 may be located on the insulating layer TFL. The second base layer SUB2 may be spaced apart from the first base layer SUB1 and face the first base layer in a third direction DR3.

A light-shielding layer BM may be located on the second base layer SUB2. FIG. 4C illustrates that the light-shielding layer BM is located on the lower surface of the second base layer SUB2 closer to the display element layer DP-OLED, but the embodiments of the inventive concept are not limited thereto, and the light-shielding layer BM may also be located on the upper surface of the second base layer SUB2.

In addition, the light-shielding layer BM may include an opening OEA and a portion of the second base layer SUB2 may be exposed by the opening OEA.

Actually, the light-shielding layer BM may include a plurality of openings OEA. According to some example embodiments of the inventive concept, the area of the opening OEA may be larger than the area of the light-emitting region EA. Accordingly, the opening OEA may overlap each of the light emitting region EA and the non-light-emitting region NEA. In addition, because the area of the opening OEA is larger than that of the light-emitting region EA, a wide viewing angle may be ensured. The light output through the light-emitting region EA may be transmitted through the opening OEA.

Referring again to FIG. 3, the input detection unit TS may be located on the insulating layer TFL. The input detection unit TS may be located directly on the insulating layer or may be connected to the insulating layer TFL through an adhesive layer in another embodiment. The input detection unit TS may include a single-layer or a multilayered conductive layer. In addition, the input detection unit TS may include a single-layer or a multilayered insulating layer.

The input detection unit TS may detect an input applied from the outside, for example, through a capacitive method. The input applied from the outside may be provided in various forms. For example, the external input includes various types of external inputs, such as a portion of the body of a user, a stylus pen, light, heat, or pressure. In addition, not only the input made by a contact with a portion of the body such as a hand of a user, but also a touch (for example, hovering) which approaches or is adjacent to a space may be one type of the input.

The operation type of the input detection unit TS is not particularly limited, and the input detection unit TS may also detect an external input through an electromagnetic induction method or a pressure detection method. Meanwhile, according to some example embodiments of the inventive concept, the input detection unit TS may be separately manufactured and attached to the display panel DP through an adhesive layer, or the input detection method TS may be omitted.

Figure 5:
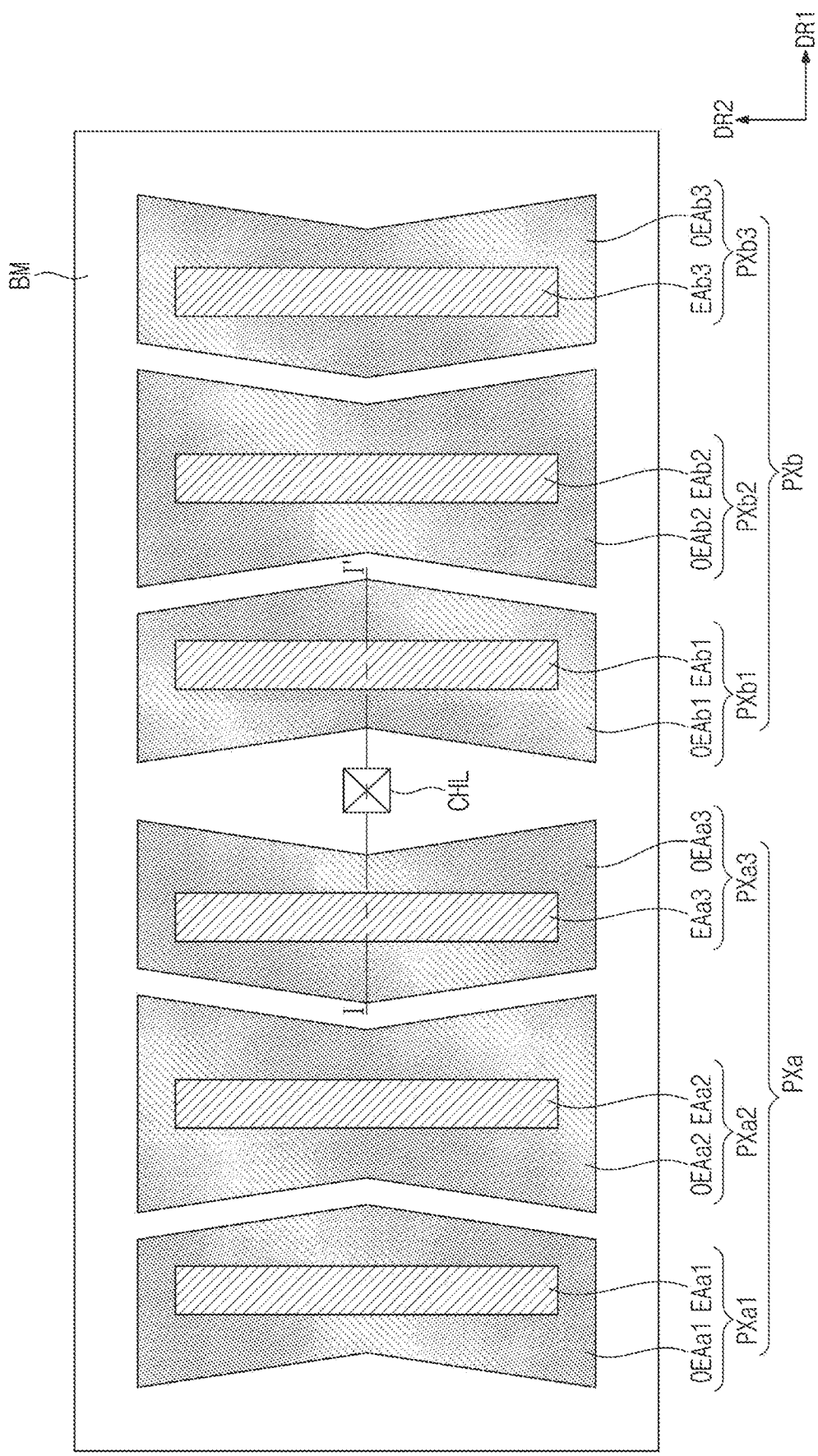
FIGS. 5 and 6 are plan views of pixels according to some example embodiments of the inventive concept.
Figure 6:
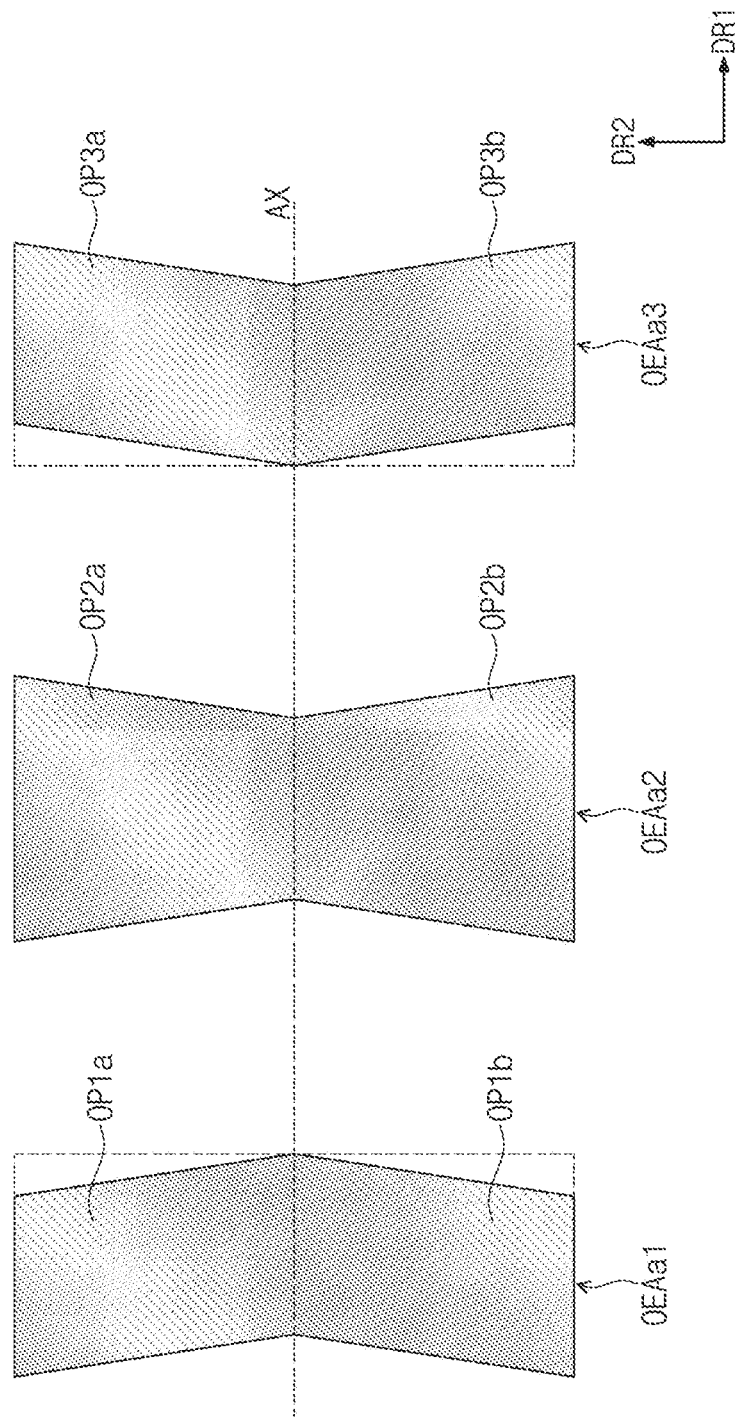
Figure 7:
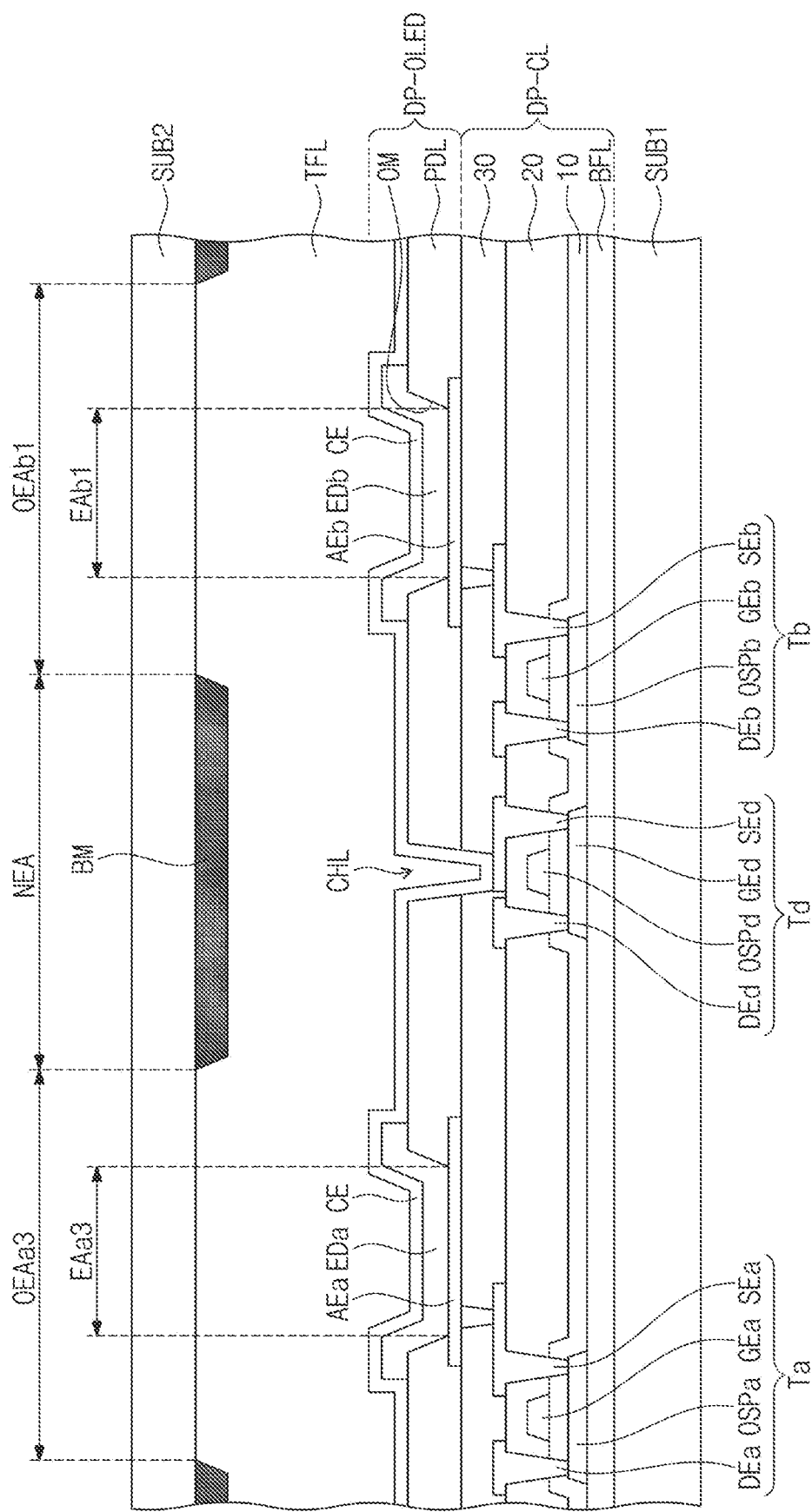
FIG. 7 is a cross-sectional view of a display panel taken along the line I-I' shown in FIG. 5.

FIGS. 5 and 6 are plan views of pixels according to some example embodiments of the inventive concept. FIG. 7 is a cross-sectional view of a display panel taken along the line I-I' shown in FIG. 5.

Each of the pixels PX shown above in FIG. 2 may include a plurality of first to third sub pixels which output colors different from each other. Through FIGS. 5 and 6, illustrated are a first pixel PXa and a second pixel PXb which are arranged in the same row and continue in a first direction DR1.

The first pixel PXa includes first to third sub pixels PXa1, PXa2, and PXa3 which are continued in the first direction DR1, and the second pixel PXb includes first to third sub pixels PXb1, PXb2, and PXb3 which are continued in the first direction DR1.

The first sub pixel PXa1 includes a first light-emitting region EAa1 and a first opening OEAa1 surrounding the first light-emitting region EAa1. The first sub pixel PXa1 outputs a first color light through the first light-emitting region EAa1, and the output first color light may be transmitted to the outside through the first opening OEAa1.

The second sub pixel PXa2 includes a second light-emitting region EAa2 and a second opening OEAa2 surrounding the second light-emitting region EAa2. The second sub pixel PXa2 outputs a second color light through the second light-emitting region EAa2, and the output second color light may be transmitted to the outside through the second opening OEAa2.

The third sub pixel PXa3 includes a third light-emitting region EAa3 and a third opening OEAa3 surrounding the third light-emitting region EAa3. The third sub pixel PXa3 outputs a third color light through the third light-emitting region EAa3, and the output third color light may be transmitted to the outside through the third opening OEAa3. The first to third colors are provided in different colors from each other.

The above-mentioned first to third light-emitting regions EAa1 to EAa3 are defined by the pixel defining film PDL, and the first to third openings OEAa1 to OEAa3 are defined by the light-shielding layer BM. In addition, on a plane, the first to third openings OEAa1 to OEAa3 are spaced apart from each other, and the light-shielding layer BM may be located between the spaced-apart portions.

The structures of the first to third sub pixels PXb1, PXb2, and PXb3 which are included in the second pixel PXb are substantially the same as those of the first to third sub pixels PXa1, PXa2, and PXa3 which are included in the first pixel PXa, and thus, some repetitive detailed descriptions thereof will be omitted.

That is, the first sub pixel PXb1 includes a first light-emitting region EAb1 which outputs the first color light and a fourth opening OEAb1 surrounding the first light-emitting region EAb1 on the plane. The second sub pixel PXb2 includes a second light-emitting region EAb2 which outputs the second color light and a fifth opening OEAb2 surrounding the second light-emitting region EAb2 on the plane. The third sub pixel PXb3 includes a third light-emitting region EAb3 which outputs the third color light and a sixth opening OEAb3 surrounding the third light-emitting region EAb3 on the plane.

Similarly, the first to third light-emitting regions EAb1 to EAb3 are defined by the pixel defining film PDL, and the fourth to sixth openings OEAb1 to OEAb3 are defined by the light-shielding layer BM. In addition, on the plane, the fourth to sixth openings OEAb1 to OEAb3 are spaced apart from each other, and the light-emitting layer BM may be located between the spaced-apart portions.

Meanwhile, the second electrode CE described with reference to FIG. 4C receives the second power supply voltage EVLSS and transmits the voltage to the organic light-emitting element ED. For example, the second electrode according to some example embodiments of the inventive concept is provided as a single integrated electrode and provided to have a small thickness to improve transmittance thereof. However, as the thickness of the second electrode CE decreases, surface resistance may be increased. When the surface resistance of the second electrode CE is increased, current attenuation of the second power supply voltage supplied to the second electrode CE may occur.

According to some example embodiments of the inventive concept, a through hole CHL may be located between two pixels which are arranged on the same row, that is, neighbor in the first direction DR1. As illustrated in FIG. 5, the through hole CHL may be located between the two neighboring pixels, that is, between the first pixel PXa and the second pixel PXb.

For example, the through hole CHL may pass through a portion of the display element layer OP-OLED and the circuit element layer DP-CL which are illustrated in FIG. 4C. The second electrode CE may be electrically connected to the circuit element layer DP-CL through the through hole CHL. As the second electrode CE is electrically connected to the circuit element layer DP-CL through the through hole CHL, the level of the resistance of the second electrode may be lowered. Consequently, the current characteristic of the second electrode may be improved. The connection structure of the second electrode and the circuit element layer DP-CL will be described in more detail with reference to FIG. 7.

On a plane, the light-shielding layer BM may surround the openings included in the first pixel PXa and the second pixel PXb. The through hole CHL may be located between the third opening OEAa3 of the third sub pixel PXa3 and the fourth opening OEAb1 of the first sub pixel PXb1.

In addition, in order to form the through hole CHL, a separation space is generated between the two openings, that is, the third opening OEAa3 and the fourth opening OEAb1. Accordingly, compared to the case in which the through hole CHL is not defined between the two openings, that is, the third opening OEAa3 and the fourth opening OEAb1, the area of the light-shielding layer BM located between the two openings, that is, the third opening OEAa3 and the fourth opening OEAb1 may be increased.

According to some example embodiments of the inventive concept, the first to third openings OEAa1 to OEAa3 or the fourth to sixth openings OEAb1 to OEAb3 may be provided in shapes different from each other. Hereinafter with reference to FIG. 6, the shapes of the first to third openings OEAa1 to OEAa3 will be described, and the fourth to sixth openings OEAb1 to OEAb3 may be provided in the same shape as these.

For example, referring to FIG. 6, on a plane, the area of the second opening OEAa2 may be larger than the area of each of the first opening OEAa1 and the third opening OEAa3. The first opening OEAa1 and the third opening OEAa3 may be line symmetric.

According to some example embodiments of the inventive concept, the second opening OEAa2 is line symmetrical according to a central axis AX, and may be provided with a first opening region OP2a and a second opening region OP2b which respectively have equilateral trapezoidal shapes. The central axis AX between the first opening region OP2a and the second opening region OP2b may be parallel to the first direction DR1.

The first opening OEAa1 is line symmetrical according to the central axis AX, and may be provided with a first opening region OP1a and a second opening region OP1b which respectively have parallelogram shapes. The third opening OEAa3 is line symmetrical according to the central axis AX, and may be provided with a first opening region OP3a and a second opening region OP3b which respectively have parallelogram shapes.

On a plane, the area of the first opening region OP2a of the second opening OEAa2 may be larger than the area of each of the first opening region OP1a of the first opening OEAa1 and the first opening region OP3a of the third opening OEAa3. The area of the second opening region OP2b of the second opening OEAa2 may be larger than the area of each of the second opening region OP1b of the first opening OEAa1 and the second opening region OP3b of the third opening OEAa3.

According to some example embodiments of the inventive concept, compared to the first to third openings provided in the rectangular shapes having the same area in the typical art, each of the first opening OEAa1 and the third opening OEAa3 according to some example embodiments of the inventive concept may be provided in shapes in which at least one opening region is more adjacent to the through hole CHL. Consequently, the area of the light-shielding layer BM defined between the two openings, that is, the third opening OEAa3 and the fourth opening OEAb1, which are illustrated in FIG. 5 may be reduced.

Through the partial cross-sectional view shown in FIG. 7, the third sub pixel PXa3 of the first pixel PXa and the first sub pixel PXb1 of the second pixel PXb are illustrated. The third sub pixel PXa3 includes the third light-emitting region EAa3 and the third opening OEAa3, and the first sub pixel PXb1 includes the first light-emitting region EAb1 and the fourth opening OEAb1.

The third sub pixel PXa3 is electrically connected to a first electrode AEa, a second electrode CEa, a first organic light-emitting element EDa, and a first transistor Ta. The first sub pixel PXb1 is electrically connected to a first electrode AEb, a second electrode CEb, a first organic light-emitting element EDb, and a second transistor Tb.

The first transistor Ta includes a first semiconductor pattern OSP1a, a first control electrode GEa, a first input electrode DEa, and a first output electrode SEa. The second transistor Tb includes a second semiconductor pattern OSP1b, a second control electrode GEb, a second input electrode DEb, and a second output electrode SEb. The first transistor Ta and the second transistor Tb may be provided in substantially the same structure as the second transistor T2 illustrated in FIG. 4C.

According to some example embodiments of the inventive concept, the circuit element layer DP-CL illustrated in FIG. 7 further includes a dummy transistor Td.

The dummy transistor Td includes a dummy semiconductor pattern OSP1d, a dummy control electrode GEd, a dummy input electrode DEd, and a dummy output electrode SEd. For example, the second electrode CE may be connected to the output electrode SEd of the dummy transistor Td via the through hole CHL.

The dummy transistor Td may be electrically separated from the first transistor Ta and the second transistor Tb. That is, the dummy transistor Td may be a feature for lowering the level of the resistance of the second electrode CE.

Figure 8A:
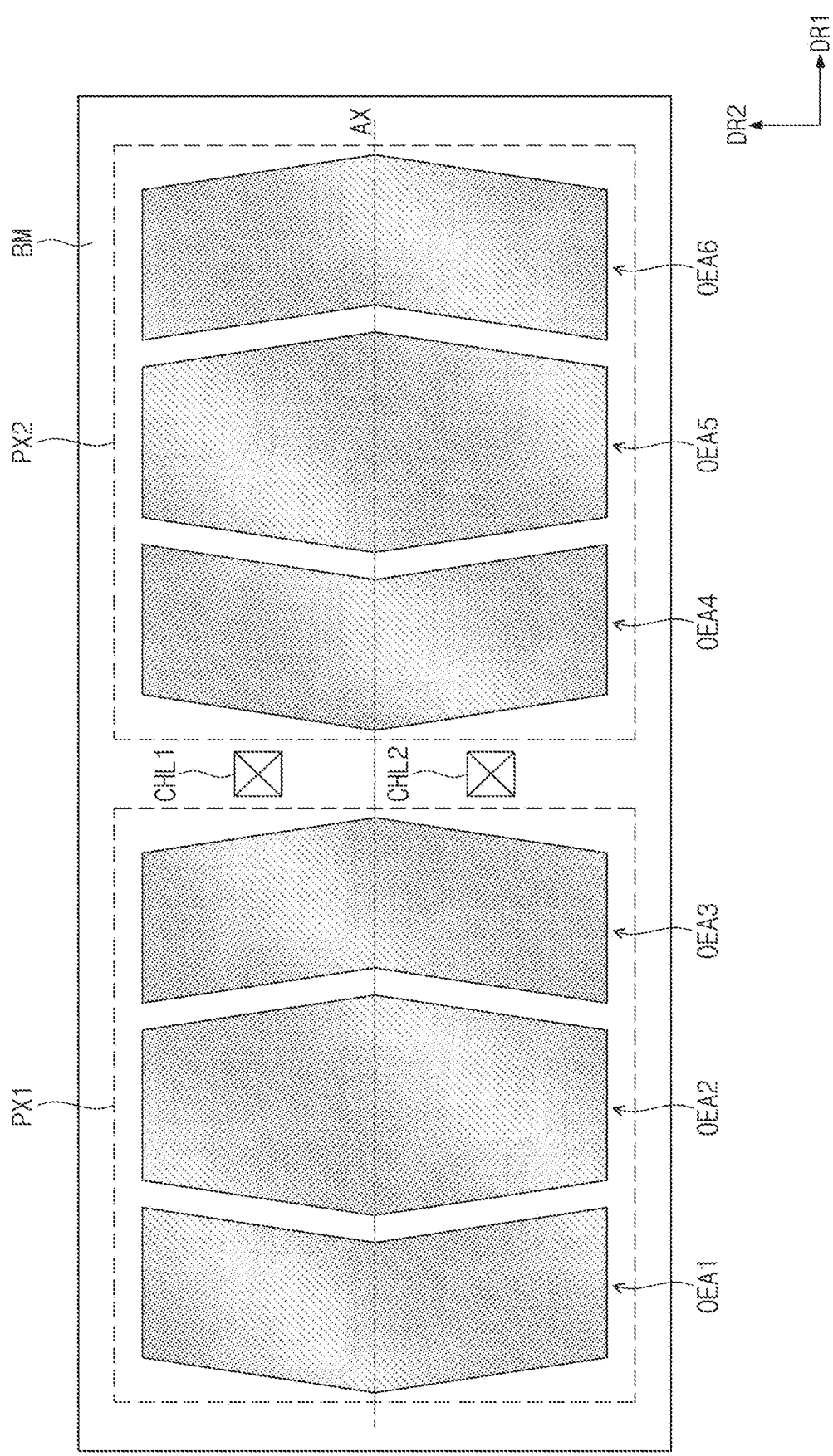
FIG. 8A is a plan view of pixels according to some example embodiments of the inventive concept.
Figure 8C:
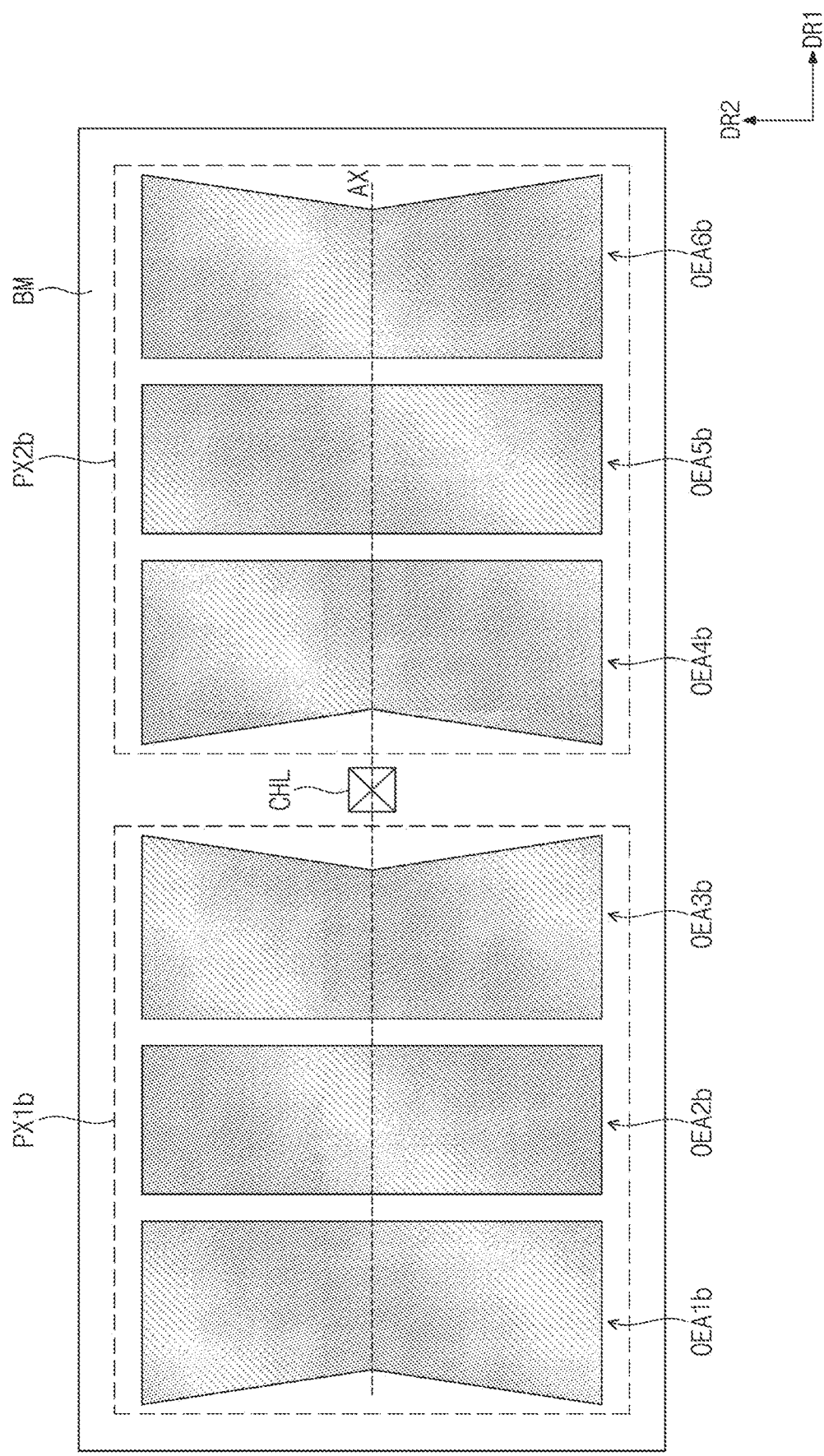
FIG. 8C is a plan view of pixels according to some example embodiments of the inventive concept.

FIG. 8A is a plan view of pixels according to some example embodiments of the inventive concept. FIG. 8B is a plan view of pixels according to some example embodiments of the inventive concept. FIG. 8C is a plan view of pixels according to some example embodiments of the inventive concept.

A first pixel and a second pixel illustrated in each of FIGS. 8A to 8C has a structure in which only the shapes of the openings and the structure of the through hole are changed in the structures of the first pixel PXa and the second pixel PXb, and the remaining portions of the structures may substantially be the same. Accordingly, for the convenience of description, descriptions on the remaining portions will be omitted.

Referring to FIG. 8A, two through holes, that is, a first through hole CHL1 and a second through hole CHL2 are provided. Each of the first through hole CHL1 and the second through hole CHL2 may pass through a portion of a display element layer OP-OLED and a circuit element layer DP-CL which are illustrated in FIG. 7. In this case, a second electrode CE is electrically connected to a first dummy transistor through the first through hole CHL1, and connected to a second dummy transistor through a\the second through hole CHL2. According to some example embodiments, the first dummy transistor and the second dummy transistor may be included in the circuit element layer DP-CL.

According to some example embodiments of the inventive concept, on a plane. a second opening OEA2 is line symmetrical according to a central axis AX, and may be provided with a first opening region and a second opening region which respectively have equilateral trapezoidal shapes. Each of the first opening OEA1 and a third opening OEA3 is line symmetrical the central axis, and may be provided with a first opening region and a second opening region which respectively have parallelogram shapes.

For example, the parallelogram shape of the first opening OEA1 illustrated in FIG. 8A may be line symmetrical to the parallelogram shape of the first opening OEAa1 illustrated in FIG. 6. In addition, the parallelogram shape of the third opening OEA3 illustrated in FIG. 8A may be line symmetrical to the parallelogram shape of the third opening OEAa3 illustrated in FIG. 6.

The shapes of the fourth opening OEA4, the fifth opening OEA5, and the sixth opening OEA6 may respectively correspond to the shapes of the first opening OEA1 and the second opening OEA2, and the third opening OEA3.

Referring to FIG. 8B, a single through hole CHL is provided between a first pixel PX1*a* and a second pixel PX2*a*. A second opening OEA2*a* may be provided in a rectangular shape. Each of a first opening OEA1*a* and a third opening OEA3*a* is line symmetrical with respect to a central axis AX, and may be provided with a first opening region and a second opening region which respectively have trapezoidal shapes. The first opening OEA1*a* and the third opening OEA3*a* may be line symmetrical to each other.

The shapes of the fourth opening OEA4*a*, the fifth opening OEA5*a*, and the sixth opening OEA6*a* may respectively correspond to the shapes of the first opening OEA1*a* and the second opening OEA2*a*, and the third opening OEA3*a*.

Meanwhile, according to the embodiments illustrated in FIGS. 8A and 8B, on a plane, the area of the second opening may be larger than the area of each of the first opening and the third opening.

Referring to FIG. 8C, on a plane, a second opening OEA2*b* may be provided in a rectangular shape. For example, the area of the second opening OEA2*b* may be smaller than the area of each of the first opening oEA1*b* and the third opening OEA3*b*. The first opening OEA1*b* and the third opening OEA3*b* may be line symmetrical to each other.

In addition, on a plane, each of the first opening OEA1*b* and the third opening OEA3*b* is line symmetrical with respect to a central axis AX, and may be provided with a first opening region and a second opening region which respectively have trapezoidal shapes.

Figure 9:
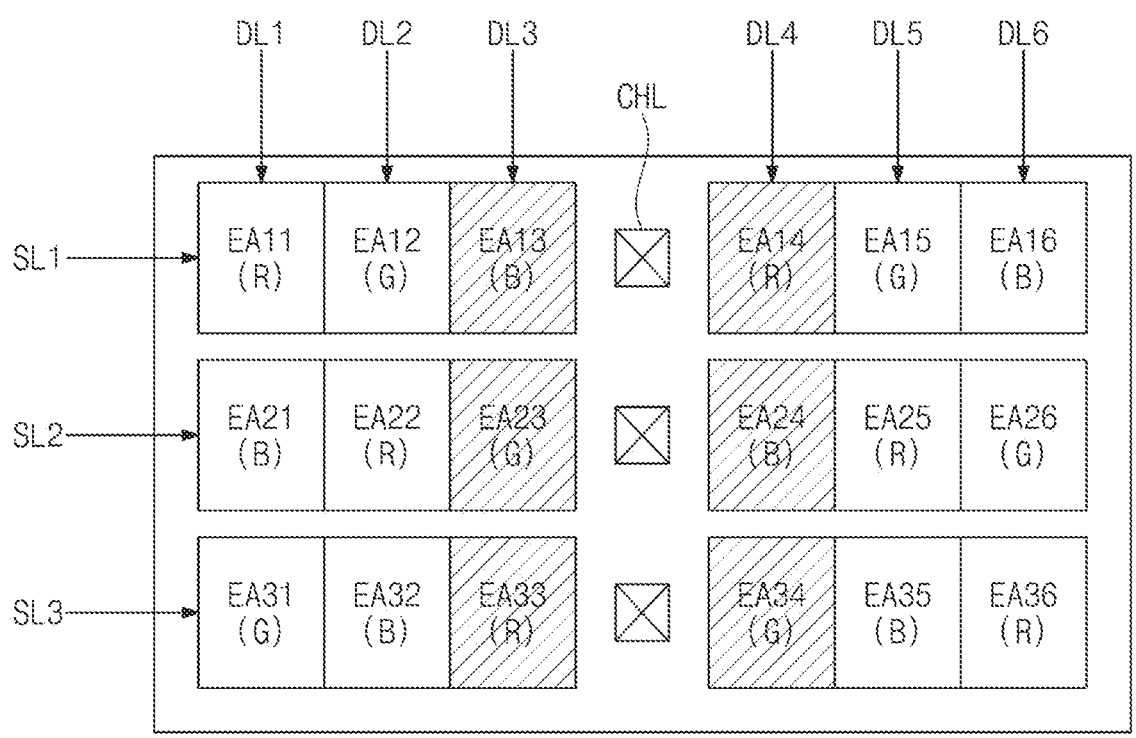
FIG. 9 is a plan view illustrating structures of light-emitting regions included in pixels according to some example embodiments of the inventive concept.
Figure 10:
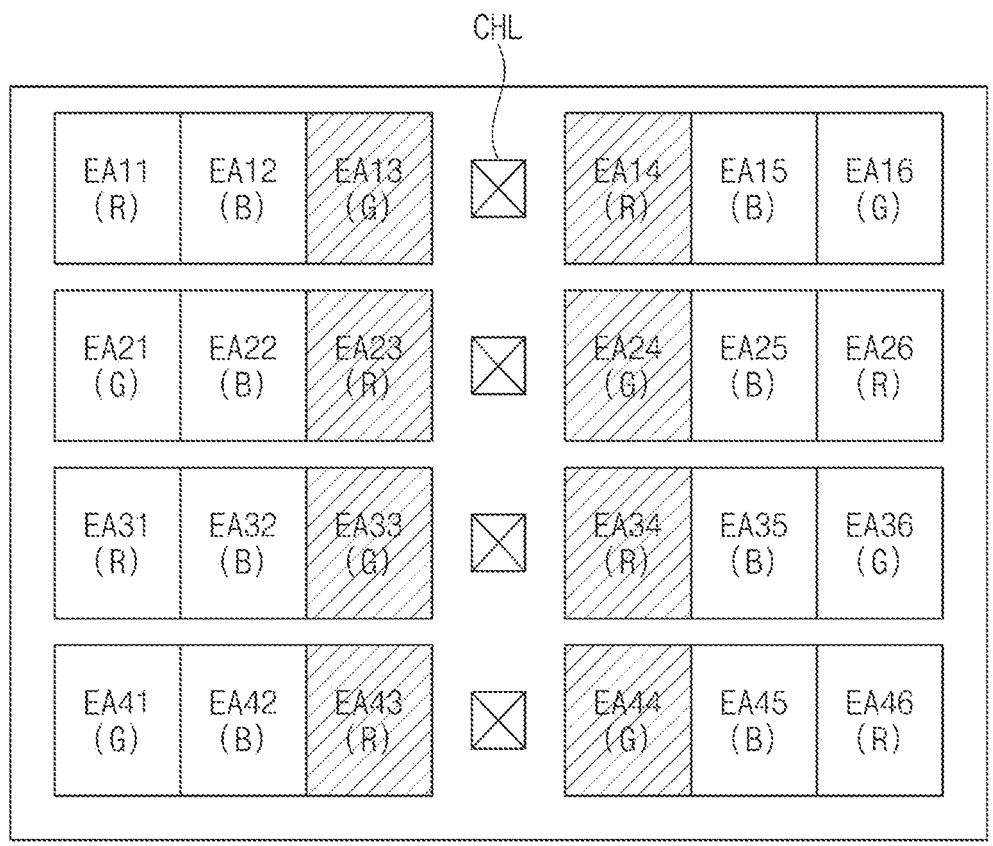
FIG. 10 is a plan view illustrating structures of light-emitting regions included in pixels according to some example embodiments of the inventive concept.
Figure 11:
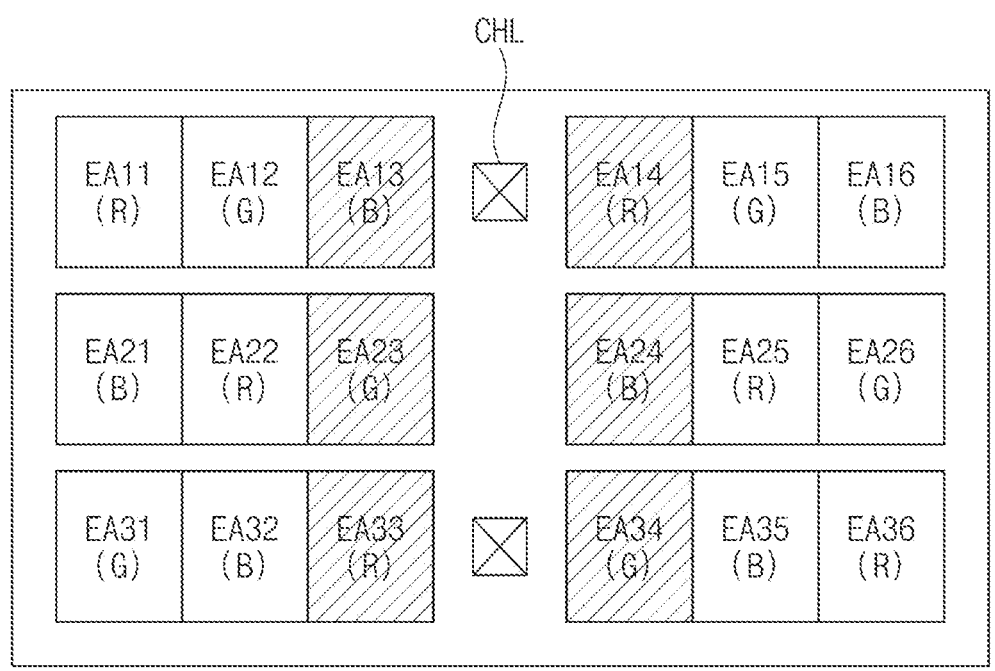
FIG. 11 is a plan view illustrating structures of light-emitting regions included in pixels according to some example embodiments of the inventive concept.

FIG. 9 is a plan view illustrating structures of light-emitting regions included in pixels according to some example embodiments of the inventive concept. FIG. 10 is a plan view illustrating structures of light-emitting regions included in pixels according to some example embodiments of the inventive concept. FIG. 11 is a plan view illustrating structures of light-emitting regions included in pixels according to some example embodiments of the inventive concept.

Referring to FIG. 9, a plurality of light-emitting groups each of which includes a plurality of sub light-emitting regions are illustrated. The sub light-lighting regions may respectively be included in each of the plurality of sub pixels.

First and second light-emitting groups are arranged along a first row. On a plane, the first and second light-emitting groups may be spaced apart from each other with a through hole CHL therebetween. The first light-emitting group includes first to third sub light-emitting regions EA11, EA12, and EA13. The first sub light-emitting region EA11 may be included in a sub pixel connected to a first scan line SL1 and a first data line DL1. The second sub light-emitting region EA12 may be included in a sub pixel connected to the first scan line SL1 and a second data line DL2. The third sub light-emitting region EA13 may be included in a sub pixel connected to the first scan line SL1 and a third data line DL3.

The second light-emitting group includes fourth to sixth sub light-emitting regions EA14, EA15, and EA16. The fourth sub light-emitting region EA14 may be included in a sub pixel connected to the first scan line SL1 and a fourth data line DL4. The fifth sub light-emitting region EA15 may be included in a sub pixel connected to a first scan line SL1 and a fifth data line DL5. The sixth sub light-emitting region EA16 may be included in a sub pixel connected to a first scan line SL1 and a sixth data line DL6.

Similarly, third and fourth light-emitting groups may be arranged along a second row, and fifth and sixth light-emitting groups may be arranged along a third row.

The light-emitting groups EA21, EA22, EA23, EA24, EA25, and EA26 which are included in the third and fourth light-emitting groups may be included in sub pixels connected to a second scan line SL2 and the first to sixth data lines DL1 to DL6. On a plane, the third and fourth light-emitting groups may be spaced apart from each other with a through hole CHL therebetween.

The light-emitting groups EA31, EA32, EA33, EA34, EA35, and EA36 which are included in the fifth and sixth light-emitting groups may be included in sub pixels connected to a third scan line SL3 and the first to sixth data lines DL1 to DL6. On a plane, the fifth and sixth light-emitting groups may be spaced apart from each other with a through hole CHL therebetween.

The through holes CHL may correspond to the through holes CHL described with reference to FIG. 5. That is, each of the through holes CHL may pass through a portion of the display element layer OP-OLED and the circuit element layer DP-CL.

Meanwhile, when external light is incident through the through holes, light leaks may occur on the basis of the color output from the light-emitting regions in the vicinity of the through holes CHL.

According to some example embodiments of the inventive concept, the third sub light-emitting region EA13 of the first light-emitting group which is most adjacent to the second light-emitting group emits light of a first color B, and the fourth sub light-emitting region EA14 of the second light-emitting group which is most adjacent to the first light-emitting group emits light of a second color R.

In addition, the third sub light-emitting region EA23 of the third light-emitting group which is most adjacent to the fourth light-emitting group emits light of a third color G, and the fourth sub light-emitting region EA24 of the fourth light-emitting group which is most adjacent to the third light-emitting group emits light of the first color B.

In addition, the third sub light-emitting region EA33 of the fifth light-emitting group which is most adjacent to the sixth light-emitting group emits light of the second color R, and the fourth sub light-emitting region EA34 of the sixth light-emitting group which is most adjacent to the fifth light-emitting group emits light of the third color G.

According to some example embodiments, the first color B may be blue, the second color R may be red, and the third color G may be green. Consequently, the light emitted from the light-emitting regions adjacent to the through holes CHL may be output as combinations of first to third colors. As a result, a light leak phenomenon in which light of a specific color leaks may be reduced.

Meanwhile, FIG. 9 illustrates an example of the first to sixth light-emitting groups, but the embodiments of the inventive concept are not limited thereto. That is, two light-emitting groups arranged in the same rows which are illustrated in FIG. 9 may repeatedly be arranged along the first direction DR1, and three light-emitting groups arranged in the same row may repeatedly be arranged in the second direction DR2.

Referring to FIG. 10, seventh to eighth light-emitting groups are further arranged along a fourth row. The light-emitting groups EA41, EA42, EA43, EA44, EA45, and EA46 which are included in the seventh and eighth light-emitting groups may be included in sub pixels connected to a fourth scan line SL4 and the first to sixth data lines DL1 to DL6. On a plane, the seventh and eighth light-emitting groups may be spaced apart from each other with a through hole CHL therebetween.

As illustrated in FIG. 10, two light-emitting groups arranged in the same row may repeatedly be arranged along the first direction DR1, and two light-emitting groups arranged in the same row may repeatedly be arranged in the second direction DR2.

The third sub light-emitting region EA13 of the first light-emitting group which is most adjacent to the second light-emitting group emits light of the third color G, and the fourth sub light-emitting region EA14 of the second light-emitting group which is most adjacent to the first light-emitting group emits light of the second color R.

In addition, the third sub light-emitting region EA23 of the third light-emitting group which is most adjacent to the fourth light-emitting group emits light of the second color R, and the fourth sub light-emitting region EA24 of the fourth light-emitting group which is most adjacent to the third light-emitting group emits light of the third color G.

In addition, the third sub light-emitting region EA33 of the fifth light-emitting group which is most adjacent to the sixth light-emitting group emits light of the third color G, and the fourth sub light-emitting region EA34 of the sixth light-emitting group which is most adjacent to the fifth light-emitting group emits light of the second color R.

In addition, the third sub light-emitting region EA43 of the seventh light-emitting group which is most adjacent to the eighth light-emitting group emits light of the second color R, and the fourth sub light-emitting region EA44 of the eighth light-emitting group which is most adjacent to the seventh light-emitting group emits light of the third color G.

According to the above description, the light emitted from the light-emitting regions adjacent to the through holes CHL may be output as combinations of second and third colors. For example, the combination of the second and third colors may be provided as a yellow color. Similarly, a light leak phenomenon, in which light of a specific color such as blue or red leaks, may be reduced.

Referring to FIG. 11, the light-emitting groups illustrated in FIG. 11 may be provided in substantially the same structure as the light-emitting groups illustrated in FIG. 9.

That is, in FIG. 11, only the configuration of the through holes CHL is changed, and the structures of the remaining portions may substantially be the same.

As illustrated in FIG. 11, the through holes CHL may respectively be provided between first and second light-emitting groups in a first row and between fifth and sixth light-emitting groups in a third row. In this case, the through holes CHL may not be provided between third and fourth light-emitting groups in a second row.

As described above, the structure in which the through holes are provided between two light-emitting groups adjacent to each other may be variously modified.

According to embodiments of the inventive concept, the shapes of openings located on a second base layer are different from each other, so that the overall opening ratio of a display device may be improved. Consequently, the overall visibility of the display device may be improved.

So far, embodiments have been disclosed in the drawings and specification. While specific terms have been used, they are not used to limit the meaning or the scope of the present invention described in claims and their equivalents, but merely used to explain the present invention. Therefore, those skilled in the art could understand that various modifications and equivalent examples can be made therefrom. Thus, the real protective scope of the present invention shall be determined by the technical scope of the accompanying claims and their equivalents.

What is claimed is:

1. A display device comprising:
    a first base layer;
    a circuit element layer on the first base layer;
    a pixel definition layer on the circuit element layer and comprising a plurality of light-emitting openings which are spaced apart from each other and define a plurality of light-emitting regions;
    a second base layer spaced apart from and facing the first base layer; and
    a light-shielding layer on the second base layer and comprising a plurality of openings respectively overlapping the light-emitting regions,
    a plurality of first electrodes on the circuit element layer and respectively having portions exposed by the light-emitting openings;
    a light-emitting layer on the first electrodes; and
    a second electrode on the pixel definition layer and covering the light-emitting layer,
    wherein the circuit element layer comprises:
    a plurality of transistors on the first base layer and electrically connected to the light-emitting layer; and
    a dummy transistor on the first base layer and electrically connected to the second electrode via the through hole,
    wherein on a plane of the first base layer, shapes of first to third openings along one direction among the openings are different from each other, and
    wherein the pixel definition layer further comprises a through hole between the first to third openings and fourth to sixth openings, the through hole being aligned with the first through sixth openings along the one direction, and the fourth to sixth openings mirroring the first to third openings relative to the through hole.

2. The display device of claim 1, wherein on the plane, an area of each of the light-emitting regions is smaller than an area of any one among the openings.

3. The display device of claim 1, wherein
    the second opening is between the first opening and the third opening, and on the plane, an area of the second opening is larger than an area of each of the first opening and the third opening.

4. The display device of claim 3, wherein
on the plane, the second opening has a first opening region and a second opening region which are symmetrical across a central axis and respectively have equilateral trapezoidal shapes, and
each of the first opening and the third opening have a third opening region and a fourth opening region which are symmetrical across to a central axis and respectively have equilateral trapezoidal shapes.

5. The display device of claim 3, wherein on the plane, the second opening has an opening region having a rectangular shape, and each of the first opening and the third opening have a first opening region and a second opening region which are symmetrical across central axes and respectively have trapezoidal shapes.

6. The display device of claim 3, wherein on the plane, the first opening and the third opening are symmetrical to each other.

7. The display device of claim 1, wherein the second opening is between the first opening and the third opening, and the first opening and the third opening are symmetrical to each other, and on the plane, an area of the second opening is smaller than an area of each of the first opening and the third opening.

8. The display device of claim 7, wherein on the plane, the second opening has an opening region having a rectangular shape, and each of the first opening and the third opening have a first opening region and a second opening region which are symmetrical across central axes and respectively have trapezoidal shapes.

9. The display device of claim 1, further comprising,
a plurality of first electrodes on the circuit element layer and respectively having portions exposed by the light-emitting openings;
a light-emitting layer on the first electrodes; and
a second electrode on the pixel definition layer and covering the light-emitting layer,
wherein the second electrode is electrically connected to the circuit element layer via the through hole overlapping the light-shielding layer.

10. The display device of claim 1, wherein shapes of the first to third openings respectively correspond to shapes of the fourth to sixth openings.

\* \* \* \* \*